(12) United States Patent
Dwilinski et al.

(10) Patent No.: US 7,410,539 B2
(45) Date of Patent: *Aug. 12, 2008

(54) TEMPLATE TYPE SUBSTRATE AND A METHOD OF PREPARING THE SAME

(75) Inventors: Robert Dwilinski, Warsaw (PL);
Roman Doradzinski, Warsaw (PL);
Jerzy Garczynski, Lomianki (PL);
Leszek Sierzputowski, Union, NJ (US);
Yasuo Kanbara, Aman (JP)

(73) Assignees: Ammono Sp. z o.o., Warsaw (PL);
Nichia Corporation, Anan-shi (JP)

( * ) Notice: Subject to any disclaimer, the term of this patent is extended or adjusted under 35 U.S.C. 154(b) by 321 days.

This patent is subject to a terminal disclaimer.

(21) Appl. No.: 10/538,654

(22) PCT Filed: Dec. 11, 2003

(86) PCT No.: PCT/JP03/15905
§ 371 (c)(1),
(2), (4) Date: Jun. 10, 2005

(87) PCT Pub. No.: WO2004/053209
PCT Pub. Date: Jun. 24, 2004

(65) Prior Publication Data
US 2006/0057749 A1 Mar. 16, 2006

(30) Foreign Application Priority Data
Dec. 11, 2002 (PL) .................................. 357696
Dec. 11, 2002 (PL) .................................. 357707
Dec. 11, 2002 (PL) .................................. 357708
Dec. 11, 2002 (PL) .................................. 357709

(51) Int. Cl.
*C30B 29/38* (2006.01)

(52) U.S. Cl. ............................. 117/71; 117/72; 117/75; 117/84; 117/94
(58) Field of Classification Search ................... 117/84, 117/94, 95, 71, 72, 75
See application file for complete search history.

(56) References Cited

U.S. PATENT DOCUMENTS 6,177,292 B1    1/2001    Hong et al.

(Continued)

FOREIGN PATENT DOCUMENTS

| EP | 1 164 210 A | 12/2001 |
|---|---|---|
| FR | 2 796 657 A | 1/2001 |
| PL | 347918 A | 6/2001 |
| WO | WO 97/13891 A | 4/1997 |
| WO | WO 02/101120 A | 12/2002 |
| WO | WO 02/101124 A | 12/2002 |

OTHER PUBLICATIONS

Liu, L. et al., "Substrate for Gallium Nitride Epitaxy", Materials Science and Engineering, 2002, pp. 61-127, R 37, No. 3, Elsevier Science B.V.

*Primary Examiner*—Robert M Kunemund
(74) *Attorney, Agent, or Firm*—Smith Patent Office

(57) ABSTRACT

The template type substrate is used for opto-electric or electrical devices and comprises A) a layer of bulk mono-crystal nitride containing at least one element of alkali metals (Group I, IUPAC 1989) and B) a layer of nitride grown by means of vapor phase epitaxy growth wherein the layer A) and the layer B) are combined at non N-polar face of the layer A) and N-polar face of the layer B). Therefore, the template type substrate has a good dislocation density and a good value of FWHM of the X-ray rocking curve from (0002) plane less than 80, so that the resulting template type substrate is very useful for the epitaxy substrate from gaseous phase such as MOCVD, MBE and HVPE, resulting in possibility of making good opto-electric devices such as Laser Diode and large-output LED and good electric devices such as MOSFET.

7 Claims, 6 Drawing Sheets

U.S. PATENT DOCUMENTS

| | | |
|---|---|---|
| 6,248,607 B1 | 6/2001 | Tsutsui |
| 6,265,322 B1 | 7/2001 | Anselm et al. |
| 6,355,497 B1 | 3/2002 | Romano et al. |
| 6,488,767 B1 | 12/2002 | Xu et al. |
| 6,656,615 B2 * | 12/2003 | Dwilinski et al. ........... 428/698 |
| 6,749,819 B2 | 6/2004 | Otsuka et al. |
| 7,132,730 B2 * | 11/2006 | Dwilinski et al. ........... 257/615 |
| 7,160,388 B2 * | 1/2007 | Dwilinski et al. ............. 117/68 |
| 2004/0238810 A1 * | 12/2004 | Dwilinski et al. ............. 257/12 |
| 2006/0054075 A1 * | 3/2006 | Dwilinski et al. ............... 117/2 |

* cited by examiner

TEMPLATE TYPE SUBSTRATE AND A METHOD OF PREPARING THE SAME

TECHNICAL FIELD

This invention is related to a template type substrate used for opto-electric devices such as LED and LD or electric devices such as MOSFET.

BACKGROUND ART

The currently used substrates for a vapor phase epitaxy typically include Sapphire, SiC, GaAs and Si and the resulting epitaxy layers grown on the substrate have been still in the unfavorably high dislocation density of $10^9/cm^2$. Therefore, there have been proposed an application of ELOG-type structures to the substrate, which allows to decrease the dislocation density down to $10^6/cm^2$, but that density is still too high to ensure the correct functioning of many electronic and opto-electronic devices, particularly high power semiconductor lasers. Further, there is another problem that the resulting substrates have a decreased epitaxy face area because of the ELOG structure. Accordingly, we have proposed the other processes for obtaining mono-crystalline gallium or aluminum-containing nitrides, For example, Polish patent application No. P-347918, where there is proposed a method of obtaining bulk mono-crystalline nitrides, represented by gallium nitride, through their re-crystallization from supercritical ammonia-containing solution. A characteristic feature of the bulk mono-crystalline gallium nitrides obtained using the afore-mentioned supercritical ammonia-containing solution is the low dislocation density (in the case of the bulk GaN: $10^4/cm^2$). It is, however, obtained at a low growth rate, in fact many times lower than the growth rate used in the growth methods from the gaseous phase.

The inventors of this invention have further discovered from their sharp researches that it is possible to significantly lower the dislocation density of the gaseous phase epitaxy layer without the ELOG structure if such a gaseous phase growth process is carried out on the surface of a substrate of bulk mono-crystalline gallium or aluminum-containing nitride made by means of crystallization from supercritical ammonia-containing solution, and also to keep all the main surface of the substrate as the complete Ga-polar face for further epitaxy process of making opto-electric or electric devices. This is quite different from the ELOG-type substrate.

DISCLOSURE OF INVENTION

Therefore, the object of this invention is to provide a template type substrate and a method of preparing a template-type substrate based on the new bulk mono-crystal of nitride.

According to a first aspect of the present invention, there is provided a template type substrate used for opto-electric or electrical devices which comprises A) a layer of bulk mono-crystal nitride containing at least one element of alkali metals (Group I, IUPAC 1989) and B) a layer of nitride grown by means of vapor phase epitaxy growth wherein the layer A) and the layer B) are combined at non N-polar face of the layer A) and N-polar face of the layer B). In this specification, the meaning of non-polar face of nitrides is a polar face of any other element than nitrogen in the nitride. In case of gallium-containing nitride the non N-polar face typically means the gallium polar face and in case of aluminum-containing nitride it typically means the aluminum polar face.

According to the present invention, we can get an excellent vapor epitaxy layer grown on Ga or Al-polar face of a mono-crystal substrate of $Al_xGa_{1-x}N$ wherein $0 \leq X \leq 1$ if the substrate can be prepared by means of a method of using a supercritical ammono solution and the resulting template type substrate comprising the layers A) and B) is very useful for making opto-electric or electrical devices by the vapor phase epitaxy growth.

In the present invention, the layer A) of bulk mono-crystal nitride includes gallium or aluminum-containing nitride and aluminum-containing nitride and is represented by the general formula of $Al_xGa_{1-x}N$ wherein $0 \leq x \leq 1$. The layer A) is normally provided as an AlN or GaN mono-crystalline substrate which can be made by supercritical ammono methods described in WO02/101120 and WO02/101124. Therefore, in this specification, the supercritical ammono method means the technology defined herein and in WO02/101120 and WO02/101124.

In the present invention, the layer B) of nitirde grown by means of vapor phase epitaxy growth is represented by the general formula of $Al_xGa_{1-x-y}In_yN$, where $0 \leq x \leq 1$, $0 \leq y \leq <1$, $0 \leq x+y \leq 1$. The layer B) can be made on a substrate having the layer A) by means of MOCVD(Metal organic chemical vapor deposition), HVPE(Hydride vapor phase epitaxy) or MBE(Molecular Beam Epitaxy) which methods are well-known to public and the skill in the art can easily apply the kind of well known vapor phase epitaxy methods to the present invention although not described therein. In the present invention, the layer B) typically includes GaN, AlGaN, InGaN and AlGaInN compound semiconductor layers.

In a preferred embodiment of the present invention, the layer B) may be composed of at least two layers and the first layer B1) may be prepared on a substrate having the layer A) by means of MOCVD or MBE and the second layer B2) may be prepared on the first layer B1) by means of HVPE as shown in FIG. 7.

The resulting template can consist of substantially complete Ga-polar face area at one of sides of the substrate, that is, more than 95%, preferably more than 99% of Ga-polar face. In comparison with HVPE GaN substrate made by the ELOG method having less than 90% of Ga-polar face area because of some of N-polar face area on the same surface, there is obtained a substrate having an excellent quality as to the dislocation density and FWHM of the X-ray rocking curve as well as the complete Ga-polar face.

According to a second aspect of the present invention, a template type substrate may comprise the layer A) of bulk mono-crystal nitride prepared on a seed having the layer B) by crystallization of nitride in a supercritical ammonium solution containing at least one element of alkali metals. In this case, as shown in FIG. 8A, the template type substrate may further comprise a layer C) of gallium or aluminum-containing nitride grown by means of vapor phase epitaxy growth wherein the layer A) of bulk mono-crystal nitride containing at least one element of alkali metals (Group I, IUPAC 1989) is prepared on both of and non N-polar face such as Ga-polar face or Al-polar face and N-polar face of the seed layer B) as layers A1) and A2) and the layer C) is combined at non N-polar face of the layer Al) and N-polar face of the layer C). Therefore, the layer C) of the gallium or aluminum-containing nitride may be prepared on a substrate of the layer A1) by means of MOCVD, HVPE or MBE. In a preferred embodiment, the layer C) can be composed of at least two layers and the first layer C1) is prepared on a substrate of the layer A1) by means of MOCVD or MBE and the second layer C2) can be prepared on the first layer C1) by means of HVPE as shown in FIG. 8B. According to this invention, the first layer C1) can protect the surface of the substrate A) not to be interfered by a HVPE process for the layer C2) and also can avoid diffusion of Alkali metals from the substrate A) to the layer C2). The layer C1) is preferably prepared at a temperature lower than a formation temperature of mono-crystal thereof.

According to this invention, there can be obtained a template type substrate having a dislocation density of $10^6/cm^2$ or less as well as the value of FWHM of the X-ray rocking curve from (0002) plane less than 80 arcsec.

In the supercritical ammono process, we have discovered that A-axis growth is 4 times or more faster than that of C-axis growth and A-axis growth in the supercritical ammono method makes a dislocation density decreased too much in comparison with C-axis growth in the same supercritical ammono method. Therefore, according to the new aspect of the invention, we can get a template type substrate as shown in FIG. 9 wherein the layer A) is a substrate having a pair of C-plane surfaces and a diameter of 1 inch or more, is prepared from an original substrate indicated by dot lines made by A-axis direction growth of bulk mono-crystal nitride in a supercritical ammonium solution containing at least one element of alkali metals. It is surprised that the original substrate has a dislocation density of $10^4/cm^2$ or less.

The template type substrate according to the present invention is characterized in that even if the concentration of the alkali metal in the gallium or aluminum-containing nitride layer B) or C) and layers B1) and B2) or C1) and C2) is lower than that in the layer A) prepared by crystallization of nitride in a supercritical ammonium solution containing at least one element of alkali metals. Because the content of Alkali metals is caused by diffusion from the layer A) during the process of forming layer B) or C) and layers B1) and B2) or C1) and C2). In this case, the layer B), B1), C) or C1) may be prepared by MOCVD or MBE and preferably has a thickness of 0.1 to 3 µm.

In case of the template type substrate according to the present invention, the layer C) obtained by the growth method from the gaseous phase is also represented by the general formula of $Al_xGa_{1-x-y}In_yN$, where $0 \leq x \leq 1$, $0 \leq y < 1$, $0 \leq x+y \leq 1$ as shown in the definition of the layer B). Therefore, in a preferred embodiment of the present invention, the layer B) or C) may be combination of double layers AlGaN and GaN. In case of the first layer B1) or C1) of AlGaN formed at a lower temperature than that of mono-crystal, the second layer B2) or C2) of GaN will be improving in a quality of crystalline.

In case of the template type substrate according to the present invention, the layer B) or C) is a gallium or aluminum-containing nitride containing silicon (Si) or oxygen (O) as donor dopants or a gallium or aluminum-containing nitride containing magnesium (Mg) or zinc (Zn) as acceptor dopants because of vapor phase epitaxy growth. The concentration of dopants preferably ranges between $10^{17}/cm^3$ and $10^{21}/cm^3$.

According to a third aspect of the present invention, there is provided a process of preparing a template type substrate which comprises steps of:

(a) preparing a layer A) of bulk mono-crystal nitride containing at least one element of alkali metals (Group I, IUPAC 1989) to have a thichness for substrate by crystallization of gallium or aluminum-containing nitride on a seed from a super-critical ammonia-containing solution, and (b) forming a layer B) of nitride by means of vapor phase epitaxy growth on Al or Ga-polar face of the layer A) to get a substrate comprising the layer A) and the layer B) combined at Al or Ga-polar face of the layer A) and N-polar face of the layer B).

In a preferred embodiment of the present invention, it may be needed a further step of (c) polishing one of the faces of the layer B) to get a substrate for vapor phase epitaxy in order to get a good surface property for further epitaxy growth. The resulting template type substrate may be subjected to an annealing treatment of the substrate comprising the layers A) and B) in an atmosphere that does not contain hydrogen at a temperature between approx. 600 and 1050° C., thus producing material with better crystalline quality than before the annealing. The step of annealing is preferably carried out in the atmosphere of inert gas with an addition of oxygen between 10 and 30 vol. % and the step of annealing can be carried out in a single step or in multiple steps until the desired level of impurities (such as hydrogen and/or ammonia or ions formed from the impurities formed during the crystallization and/or annealing process) is reached.

Further, it is sometimes needed to remove impurities from bulk mono-crystalline nitride by a process of rinsing in the environment of supercritical ammonia-containing solvent, water or carbon dioxide or being subjected to the action of gaseous hydrogen, nitrogen or ammonia. In this case, it is preferably to carry out the step of rinsing with aid of the application of ultrasounds or the exposure to an electron beam.

BEST MODE FOR CARRYING OUT THE INVENTION

Figure 1:
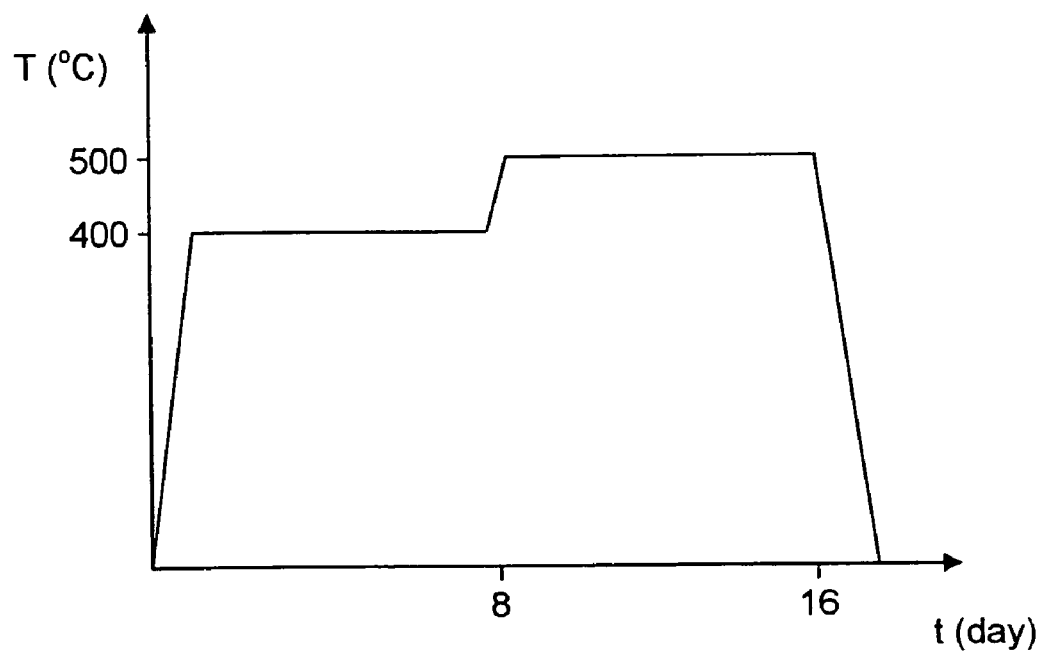
FIG. 1 is a graph showing the change in time of the temperature in the autoclave where p=const and shows the relation between the changes in the temperature and the dissolution and crystallization processes in the case of this invention.

This invention is based on an ammono-basic growth of the crystal and allows to obtain mono-crystalline gallium or aluminum-containing nitride selectively deposited on the seed's surface by way of creating chemical transport in a supercritical ammonia-containing solvent containing one or more mineralizers affecting its ammono-basic nature.

This process is characterized in that it allows to obtain bulk mono-crystalline template-type substrate with a layer of high structural quality, in which on the gallium or aluminum-containing nitride layer obtained by the growth method from the gaseous phase a gallium or aluminum-containing nitride layer was deposited thanks to the fact that in the autoclave a supercritical ammonia-containing solution and alkali metal ions are created. In the autoclave the feedstock is dissolved, followed by selective crystallization of the gallium or aluminum-containing nitride from the solution on the seed surface at a higher temperature and/or lower pressure than that of the process of dissolving the feedstock containing gallium in the supercritical solvent.

The objective of the first embodiment is to perform a selective crystallization on the seed surface during the second process—crystallization. Therefore, the second embodiment of this invention concerns the process of crystallization of the bulk mono-crystalline gallium or aluminum-containing nitride, characterized in that it allows to obtain a bulk mono-crystalline template-type substrate with a high structural quality layer, in which on the gallium or aluminum-containing nitride layer obtained by the growth method from the gaseous phase, a gallium or aluminum-containing nitride layer with high structural quality was deposited, and consists in conducting a dissolution in supercritical ammonia-containing solution and alkali metal ions, creating supercritical solution with a negative temperature coefficient of gallium nitride solubility and, at least in the autoclave zone in which the seed was placed, creating a zone where supercritical solution is supersaturated with respect to the seed, and regulating the concentration by appropriately increasing the temperature and/or lowering the pressure in order to ensure that no spontaneous crystallization can occur, and achieve a selective growth of the gallium or aluminum-containing nitride crystal solely on the surface of the seed placed in the autoclave.

Although in the second embodiment two zones are created simultaneously in the autoclave: the dissolution zone and the crystallization zone, it is advisable to control the supersaturation of the supercritical solution with respect to the seed by regulating the temperature of dissolution and the temperature of crystallization. Moreover, temperature management would be facilitated if the temperature in the crystallization zone is set between 300 and o 600° C., and the difference between the temperature in the dissolution zone and the crystallization zone in the autoclave is maintained below 150° C., preferably under 100° C. The supersaturation of the supercritical solution with respect to the seed can be regulated by placing one or more baffles in the autoclave to separate the dissolution zone (with low temperature) from the crystallization zone (with high temperature) and controlling the rate of the convection flow between those zones. Moreover, if the two zones are created in the autoclave: the dissolution zone and the crystallization zone, with an appropriate difference in temperature, the supersaturation of the supercritical solution with respect to the seed can be regulated by using the gallium or aluminum-containing feedstock, introduced in the form of crystalline GaN, whose total surface exceeds the total surface of the seed.

In the first embodiment ions of alkali metals are introduced in the form of alkali metals and/or alkali metal compounds and/or their mixtures, particularly those not containing elements of Group XVII (halogens). Such ions of alkali metals may include one or more types selected from $Li^+$, $Na^+$, and $K^+$. It is preferable to apply them in the form of alkali metals and their amides and azides in the molar ratio to ammonia between 1:200 and 1:2. The feedstock dissolved in the supercritical solution is gallium or aluminum-containing nitride or a gallium precursor, which may form gallium compounds soluble in the supercritical solvent.

Although the process described in this invention is based on the reactions in a clear ammono-basic environment, application of feedstock in the form of GaN obtained by the HVPE method or another chemical method is also allowed, provided that chlorine or other elements of Group XVII do not negatively affect the environment in which the reaction occurs.

The feedstock can be gallium or aluminum-containing nitride which undergoes a reversible process of dissolution in the supercritical ammonia-containing solvent. It can be also merged with metallic gallium which undergoes an irreversible reaction in the supercritical solvent.

The use of gallium or aluminum-containing nitride in the form of gallium nitride facilitates the control over the crystallization process. It is preferable to use the seeds of monocrystalline GaN, although the following can also be used: GaN obtained through the HVPE method or the flux method, the seeds obtained through the high-pressure method, the seeds with A ($11\bar{2}0$), M ($1\bar{1}00$), or R ($1\bar{1}02$) surfaces cut out from the bulk mono-crystal obtained from supercritical ammono method. For the purposes of the crystallization it is also possible to use the C (0001) surface having N-polarity.

In this invention, the processes of dissolution and crystallization are usually carried out at in parallel, and they are concurrently spatially separated in the autoclave. In other words, the supercritical ammonia-containing solvent is obtained in the autoclave, which contains ions of alkali metals. This solvent dissolves the gallium or aluminum-containing feedstock, and crystallization of gallium or aluminum-containing nitride is carried out from the supercritical solution on the surface of seed in the conditions of a higher temperature and/or lower pressure than that for the process of dissolution of the feedstock.

In the first embodiment it is recommended that the process of dissolving the gallium or aluminum-containing feedstock be supplemented with a separate process of transferring the supercritical solution to a place with higher temperature and/or lower pressure. In this case, in the autoclave at least two zones are formed with different temperature, and the gallium or aluminum-containing feedstock is placed in the dissolution zone with low temperature while the seed is placed in the crystallization zone with high temperature. The difference in temperature between the dissolution zone and the crystallization zone should be set in such a way as to ensure chemical transport through the supercritical solution, which occurs mainly through the process of convection. The difference in temperature between the dissolution zone and the crystallization zone exceeds 1° C., preferably between 5 and 150° C., and most preferably below 100° C.

Preferably, the nitride obtained in this invention has the formula of $Al_xGa_{1-x-y}In_yN$, where $0 \leq x \leq 1$, $0 \leq y < 1$, $0 \leq x+y \leq 1$. The supercritical solvent is defined as follows: it contains $NH_3$ and/or its derivatives and a mineralizer in the form of alkali metal ions, or at least sodium or potassium ions. The feedstock consists primarily of gallium or aluminum-containing nitride or its precursors selected out of the group including: azides, imides, amido-imides, amides, hydrides, gallium or aluminum-containing metallic compounds and alloys, as well as metallic gallium. The definition of a precursor can be found further in this document.

In this invention, the seed contains at least a crystalline layer of gallium or aluminum-containing nitride or other elements of Group XIII (IUPAC 1989). It is preferable that the surface dislocation density of that layer be lower than $10^6/cm^2$.

In this invention, crystallization of gallium or aluminum-containing nitride can occur in the temperature between 100 and 800° C., preferably between 300 and 600° C., and most preferably between 400 and 550° C. During crystallization of the gallium or aluminum-containing nitride the pressure can range between 10 and 1000 MPa, preferably between 100 and 550 MPa, and most preferably between 150 and 300 MPa.

The concentration of alkali metal ions in the supercritical solvent is regulated in such a way as to ensure proper solubility properties of the feedstock and the gallium or aluminum-containing nitride, and the molar ratio of alkali metal ions to other species in the supercritical solvent is controlled in the range from 1:200 to 1:2, preferably between 1:100 and 1:5, and most preferably between 1:20 and 1:8.

In this invention, the growth of a mono-crystalline gallium or aluminum-containing nitride is obtained by chemical transport in the supercritical solvent containing one or more mineralizers affecting its ammono-basic nature. Thus, this is the technique of ammono-basic crystallization, and the terms used in this invention should be understood in accordance with the following definitions:

Group XIII element(s) nitride means a nitride of Group XIII element(s), i.e. aluminum, gallium and indium either alone or in any combination. Gallium-containing nitride is the most preferred such nitride.

Gallium- or aluminum-containing nitride means a nitride of gallium (or: aluminum) and optionally other element(s) of Group XIII (according to IUPAC, 1989). It includes, but is not restricted to, the binary compound—GaN (or AlN), a ternary compound—AlGaN, InGaN or a quaternary compound AlInGaN, preferably containing a substantial portion of gallium, anyhow at the level higher than dopant content. The composition of other elements with respect to gallium (aluminum) may be modified in its structure insofar as it does not collide with the ammono-basic nature of the crystallization technique. (The mentioned formulas are only intended to give the components of the nitrides. They are not intended to indicate their relative amounts.)

Bulk mono-crystal of gallium- or aluminum-containing nitride means a mono-crystalline substrate in the form of gallium or aluminum-containing nitride, on which optoelectronic devices may be obtained, such as: light-emitting diodes (LED) or laser diodes (LD) by the MOCVD method or by the methods of epitaxy growth such as the HVPE method.

C-, A- or M-plane refers to C-, A- or M-plane surfaces of hexagonal Group XIII element nitride crystals.

Precursor of gallium- or aluminum-containing nitride is a substance or a mixture containing at least gallium (aluminum), which may also contain alkali metals, elements of Group XIII (according to IUPAC 1989), nitrogen and/or hydrogen, and metallic gallium, its alloys or metallic compounds, hydrides, amides, imides, amido-imides and azides, which may form gallium compounds soluble in the supercritical ammonia-containing solvent as defined below.

Gallium- or aluminum-containing feedstock is gallium- or aluminum-containing nitride or its precursor. Feedstock can be in the form of: GaN (AlN) obtained by any method, e.g. flux methods, HNP method, HVPE method, or polycrystalline GaN (AlN) obtained in situ from metallic gallium (aluminum) as the result of a chemical reaction in the supercritical ammonia-containing solvent.

Supercritical ammonia-containing solvent is a supercritical solvent consisting at least of ammonia, which contains one or more types of ions of alkali metals, used for dissolution of gallium- or aluminum-containing feedstock. The supercritical ammonia-containing solvent may also contain derivatives of ammonia and/or their mixtures, in particular—hydrazine.

Mineralizer is a substance delivering one or more types of ions of alkali metals to the supercritical ammonia-containing solvent, supporting dissolution of gallium- or aluminum-containing nitride.

Substances containing oxygen-free species causing the weakening of ammono-basic nature of the supercritical solution are selected from the group which includes:

a) compounds $A_mB_n$, where A means H+ and/or metal, preferably alkali, $NH_4^+$, Si, S, P, whereas B means halogens, S, P, and n and m mean corresponding stoichiometric coefficients not lower than 1 and/or b) groups of species such as:
$S_4N_4$, $S_2N_2$, SN, $S_4N_2$, $S_{11}N_2$, $P_3N_5$, $P_4N_6$, PN, $PN_2^-$, $PN_3^{4-}$, $PN_4^{7-}$, $PN^-$, $PN^{2-}$,
$PNCl_2$, $P(NH)_2NH_2$, $P_4S_{10}$, $NP(SNH_4)_2$, $NPSNH_4SH$, $NP(SH)_2$, PNS, Sulfur or silicon species built in the crystalline lattice of the gallium-containing nitride serve as donors; magnesium, zinc or cadmium are acceptors; dopants such as manganese or chromium in the crystalline gallium nitride lattice provide it with magnetic properties; whereas phosphor atoms are isoelectronic with respect to nitrogen atoms, and thus they make the energy gap narrower than that in the pure gallium-containing nitride. Those species do not only cause the weakening of ammono-basic nature of the supercritical solvent, but they also modify optical, electrical and magnetic properties of the gallium-containing nitride.

Dissolution of the gallium-containing feedstock is a reversible or irreversible process of formation, through the feedstock, of gallium compounds soluble in the supercritical solvent, for example gallium complexes. Gallium complexes are chemical complex compounds, in which centrally placed gallium atom is surrounded by $NH_3$-type ligands or their derivatives, such as $NH_2^-$, $NH^{2-}$. Analogical definition for dissolution of the aluminum-containing feedstock applies.

Supercritical ammonia-containing solution means a solution obtained as a result of dissolution of the gallium- or aluminum-containing feedstock in the supercritical ammonia-containing solvent.

Solubility: Our experiences show that equilibrium may be achieved between the solid, which is gallium- or aluminum-containing nitride, and the supercritical solution at sufficiently high temperature and pressure. Therefore, solubility of gallium- or aluminum-containing nitride may be defined as the equilibrium concentration of soluble gallium (aluminum) compounds obtained in the above mentioned process of dissolution of gallium- or aluminum-containing nitride. In this process, the equilibrium concentration, i.e. solubility, may be controlled by modifying the composition of the solvent, temperature and/or pressure.

Figure 2:
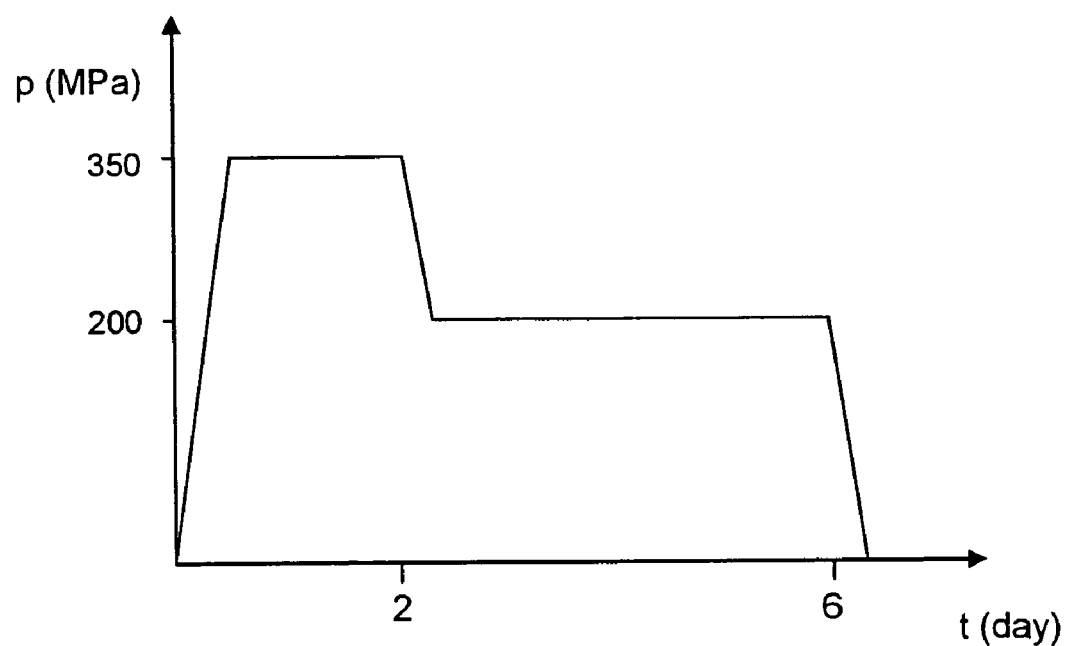
FIG. 2 is a graph showing the change in time of the pressure in the autoclave where T=const and illustrates the relation between the changes in the pressure and the processes of dissolution and crystallization in the case of this invention.

Negative temperature coefficient of solubility (negative TCS) means that the solubility of the respective compound is a monotonically decreasing function of temperature if all the other parameters are kept constant. Similarly, positive pressure coefficient of solubility (positive PCS) means that, if all the other parameters are kept constant, the solubility is a monotonically increasing function of pressure. In our research we have shown that the solubility of gallium- or aluminum-containing nitride in supercritical ammonia-containing solvent possesses a negative temperature coefficient and a positive pressure coefficient in temperature ranging at least from 300° C. to 550° C. and pressure from 100 to 550 MPa. This means that in accordance to FIG. 1, after dissolution of feedstock in an autoclave kept for 8 days at the temperature 400° C. (i.e. after dissolution step)

re-crystallization of gallium nitride may be achieved by increasing the temperature inside the autoclave to 500° C., while keeping constant pressure of 200 MPa (crystallization step). On the other hand, as shown in FIG. 2, after dissolution of a feedstock at increased pressure in an autoclave kept for 2 days at the level of 350 MPa (i.e. after dissolution step), re-crystallization of gallium nitride is achieved by means of reducing the pressure to 200 MPa while keeping constant temperature of 500° C. (crystallization step).

Supersaturation: If concentration of soluble gallium (aluminum) compounds in the supercritical ammonia-containing solution is higher than solubility of gallium- or aluminum-containing nitride in specific physico-chemical conditions, then the supersaturation of the supercritical ammonia-containing solution with respect to gallium- or aluminum-containing nitride in those conditions can be defined as the difference between the actual concentration and the solubility. While dissolving gallium- or aluminum-containing nitride in a closed system it is possible to obtain the supersaturation state, for example, by increasing temperature or decreasing pressure.

Chemical transport of gallium- or aluminum-containing nitride in the supercritical ammonia-containing solution is a continuous process involving dissolution in the supercritical solution of the gallium- or aluminum-containing feedstock, transport of soluble gallium compounds through the supercritical solution, as well as crystallization of the gallium- or aluminum-containing nitride from the supersaturated supercritical solution. Generally, the chemical transport can be caused by the difference in temperature, difference in pressure, difference in concentration, or other chemical or physical differences between the feedstock being dissolved and the crystallization product. Due to the process according to the invention, it is possible to obtain bulk mono-crystalline gallium- or aluminum-containing nitride as a result of the chemical transport in the conditions of temperature difference, yet it is necessary to maintain higher temperature in the crystallization zone than in the dissolution zone. According to the invention, the chemical transport is preferably caused by convection.

Seed as it has already been mentioned, is crucial for obtaining desired bulk gallium- or aluminum-containing nitride mono-crystals in a process according to the present invention. In view of the fact that the quality of the seed is crucial for the crystalline quality of the bulk gallium- or aluminum-containing nitride mono-crystals obtained by the process according to the present invention, the seed selected for the process should have possibly high quality. Various structures or wafers having a modified surface can also be used. For example a structure having a number of surfaces spaced adequately far from each other, arranged on a primary substrate and susceptible to the lateral overgrowth of crystalline nitrides may be used as a seed. Moreover, a seed having a homoepitaxial surface, exhibiting n-type electrical conductivity, for example doped with Si, may be used. Such seeds can be produced using processes for gallium-containing nitride crystal growth from gaseous phase, such as HVPE or MOCVD, or else MBE. Doping with Si during the growth process at the level of $10^{16}$ to $10^{21}/cm^3$ ensures n-type electric conductivity. Moreover, a composite seed may be used and in such seed directly on a primary substrate or on a buffer layer made for example of AlN—a layer made of GaN doped with Si may be deposited. Furthermore, for a particular future use, bulk mono-crystals can be grown by the process according to the present invention on homo-seeds having a defined orientation with respect to hexagonal wurzite type crystallographic lattice of the specific Group XIII element(s) nitride, such as C-plane, A-plane or M-plane of the respective nitride.

Spontaneous crystallization from the supersaturated supercritical ammonia-containing solution means any undesirable process of nucleation and growth of the gallium- or aluminum-containing nitride crystals taking place at any site within the autoclave except on the surface of the seed. The definition also includes growth on the surface of the seed, in which the grown crystal has the orientation different from that of the seed.

Selective crystallization on the seed means the process of crystallization taking place on the surface of the seed in the absence of spontaneous crystallization, but also when spontaneous crystallization occurs in negligible degree. This process is indispensable to obtain bulk mono-crystal and, at the same time, it is one of the elements of this invention.

Temperature and pressure of the reaction: In the examples presented in the specification, temperature profile inside the autoclave was measured with use of an empty autoclave, thus without supercritical ammonia-containing solution. Therefore, these are not real temperatures of the process carried out in supercritical conditions. Pressure was measured directly or calculated on the basis of physico-chemical data of ammonia-containing solvent for the assumed temperature of the process and autoclave volume.

MOCVD Method (Metallo-Organic Chemical Vapor Deposition) means the process of deposition of epitaxial layers from a gaseous phase, in which ammonia and metallo-organic gallium compounds are used as reagents in the case of gallium nitride.

HVPE Method (Halide Vapor Phase Epitaxy) means the process of deposition of epitaxial layers from a gaseous phase, in which metallic halides and ammonia are used as reagents in the case of nitrides.

Autoclave means a closed pressurized reactor, which has a reaction chamber where the ammonobasic process according to the present invention is carried out.

To implement the process according to the invention, it is preferable to use the apparatus shown in FIG. 3 and FIG. 4, described below in more detail.

The afore-mentioned process and the apparatus allow to obtain bulk mono-crystalline gallium or aluminum-containing nitride. The bulk mono-crystal has low dislocation density (in the case of bulk GaN: $10^4/cm^2$). It is important that bulk mono-crystalline GaN may have the diameter of over 1 inch and, at the same time, thickness of 3 mm (preferably 5 mm). Slicing it with a wire saw into wafers allows to obtain 0.5 mm thick bulk mono-crystalline substrates. Bulk mono-crystalline substrates can be later used as seeds. In order to improve their n-type electrical conductivity it is preferable to increase the concentration of n-type carriers by Si doping during the growth from the gaseous phase.

If gallium or aluminum-containing nitride is deposited using the growth method from the gaseous phase, it would be preferable for the gallium or aluminum-containing nitride, obtained in supercritical ammonia, to have the form of $Al_xGa_{1-x}N$ ($0 \leq x \leq 1$) or to use bulk mono-crystalline $Al_xGa_{1-x}N$ ($0 \leq x \leq 1$) deposited on GaN. By Si doping of gallium or aluminum-containing nitride during the growth from the gaseous phase it is possible to obtain $Al_xGa_{1-x-y}In_yN$ ($0 \leq x \leq 1, 0 \leq y \leq 1, 0 \leq x+y \leq 1$) with n-type electrical conductivity, and since it was crystallized on gallium or aluminum-containing nitride obtained in supercritical ammonia in the conditions of growth from the gaseous phase it is possible to use it to create template-type substrate with high crystalline quality and the dislocation density below $10^5/cm^2$.

A preferable embodiment of this invention

The process according to this invention allows to separate the process of dissolving the feedstock from the process of transferring the supercritical solution to a higher temperature and/or lower pressure, wherein crystallization of gallium or aluminum-containing nitride occurs on the surface of the seed. Moreover, the process comprises a step of simultaneous creation of at least two zones with different temperature in the autoclave, whereas the gallium or aluminum-containing feedstock is placed in the dissolution zone with a lower temperature and the seed being placed in the crystallization zone with a higher temperature. The difference in temperature between the dissolution zone and the crystallization zone is controlled in such a way as to ensure chemical transport through the supercritical solution by way of convection, with the difference in temperature between the dissolution zone and the crystallization zone exceeding 1° C. The gallium or aluminum-containing nitride obtained in the supercritical ammonia has the form of $Al_xGa_{1-x}N$, where $0 \leq x < 1$, while the gallium or aluminum-containing nitride obtained from the gaseous phase has the form of $Al_xGa_{1-x-y}In_yN$ where $0 \leq x \leq 1$, $0 \leq y < 1$, $0 \leq x+y \leq 1$, and may contain donor-type, acceptor-type or magnetic-type dopants. Ammonia, containing alkali metal ions and/or its derivatives may serve as the supercritical solvent. The feedstock mainly consists of gallium or aluminum-containing nitride or its precursors selected from the group consisting of azides, imides, amido-imides, amides, hydrides, metallic compounds and gallium or aluminum-containing alloys, as well as metallic gallium. The seed contains at least a crystalline layer of gallium or aluminum-containing nitride or other elements of Group XIII (according to IUPAC, 1989).

Crystallization of gallium or aluminum-containing nitride occurs at the temperature from 100 to 800° C. and under pressure from 10 to 100 MPa, while the concentration of alkali metal ions in the supercritical solvent is controlled in such a way as to ensure proper solubility of the feedstock and gallium or aluminum-containing nitride. The molar ratio of alkali metal ions to other species in the supercritical solvent is controlled in the range from 1:200 to 1:2.

The performed measurements showed that the best obtained bulk mono-crystalline GaN can have a dislocation density below $10^4/cm^2$ with simultaneous half width of the X-ray rocking curve from (0002) plane below 60 arcsec, which guarantees the proper quality and life of semiconductor devices. At the same time, due to the electrical conductivity of the substrate, n-type pad electrode can be deposited on it.

Figure 5:
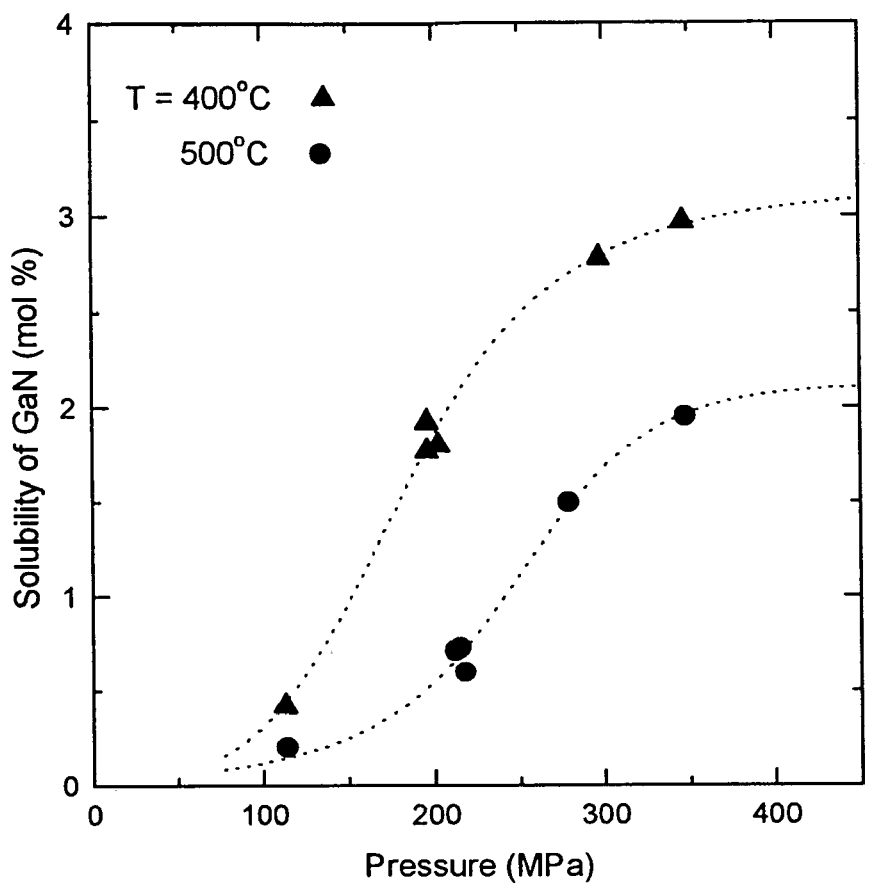
FIG. 5 is a graph showing the relationship between the solubility of GaN in the supercritical ammonia which contains potassium amides (with Mineralizer: $NH_3$=0.07) and the pressure, where T=400° C. and T=500° C.; finally.

GaN shows good solubility in the supercritical $NH_3$ provided that alkali metals or their compounds, such as $KNH_2$, are introduced into it. The diagram in FIG. 5 presents GaN solubility in a supercritical solvent in the function of pressure for the temperature 400 and 500° C., with solubility being defined as the molar ratio: $S_m \equiv GaN^{solution}:(KNH_2+NH_3) \times 1000\%$. In the presented example, the solvent is in the form of $KNH_2$ solution in the supercritical ammonia with the molar ratio of $x \equiv KNH_2:NH_3$ equal to 0.07. It should be expected that solubility $S_m$ is a smooth function of temperature, pressure, and mineralizer's content, expressed by the equation $S_m \equiv S_m(T,p,x)$. Infinitesimal changes of $S_m$ can be expressed as follows:

$$\Delta S_m \approx (\partial S_m/\partial T)_{p,x} \Delta T + (\partial S_m/\partial p)_{T,x} \Delta p + (\partial S_m/\partial x)_{T,p} \Delta x,$$

where the partial derivatives $(\partial S_m/\partial T)_{p,x}$, $(\partial S_m/\partial p)_{T,x}$, $(\partial S_m/\partial x))_{T,p}$ specify the behavior of $S_m$ with changes in particular parameters. In this description those derivatives are called "coefficients" (e.g., $(\partial S_m/\partial T)_{p,x}$ is referred to as "the temperature coefficient of solubility (TCS)").

FIG. 5 shows that the solubility increases with pressure and decreasing with temperature. Those relationships allow us to obtain bulk mono-crystalline gallium or aluminum-containing nitride through its dissolution in the higher-solubility conditions and its crystallization in the lower-solubility conditions. The negative temperature coefficient means that in the presence of a temperature gradient, the chemical transport of gallium or aluminum-containing nitride will occur from the dissolution zone with lower temperature to the crystallization zone with higher temperature. It has turned out that other gallium compounds, even metallic gallium, may also be the source of ammonia complexes of gallium. For example, gallium complexes of the composition specified above can be introduced into a solvent based on the simplest substrate, such as metallic gallium. Then, by appropriately modifying the conditions (e.g., by raising the temperature) it is possible to obtain a solution supersaturated with respect to gallium or aluminum-containing nitride as well as crystallization on the seed. The process according to this invention allows to obtain growth of bulk mono-crystalline gallium or aluminum-containing nitride on the seed and leads in particular to the creation of a stoichiometric gallium nitride obtained in the form of a bulk mono-crystalline layer on a gallium-nitride seed. Since such a mono-crystal is obtained in a supercritical solution containing alkali metal ions, it also contains alkali metals in the concentration higher than 0.1 ppm. Because it is preferable to maintain the purely basic nature of the supercritical solution (mainly in order to avoid corrosion of the apparata), halides are purposefully not introduced into the solvent. The process according to this invention also allows us to purposefully substitute from 0.05 to 0.5 Ga with Al. The possibility to smoothly change the composition results in the ability to control the lattice constant of the obtained nitride. Moreover, the bulk mono-crystalline GaN can receive donor-type dopants (e.g., Si, O) and/or acceptor-type dopants (e.g., Mg, Zn) and/or magnetic-type dopants (e.g., Mn, Cr) in the concentrations of between $10^{17}$ and $10^{21}/cm^3$. Those dopants modify the opto-electric, electric, and magnetic properties of gallium or aluminum-containing nitride. With regard to other physical properties, the bulk mono-crystalline gallium nitride being obtained has the surface dislocation density below $10^6/cm^2$, preferably below $10^5/cm^2$, and most preferably below $10^4/cm^2$. Moreover, its half width of the X-ray rocking curve from (0002) plane is below 600 arcsec, preferably below 300 arcsec, and most preferably below 60 arcsec. The best obtained bulk mono-crystalline gallium nitride may have the surface dislocation density below $10^4/cm^2$ and at the same time the half width of the X-ray rocking curve from (0002) plane below 60 arcsec (for Cu K $\alpha_1$).

Figure 3:
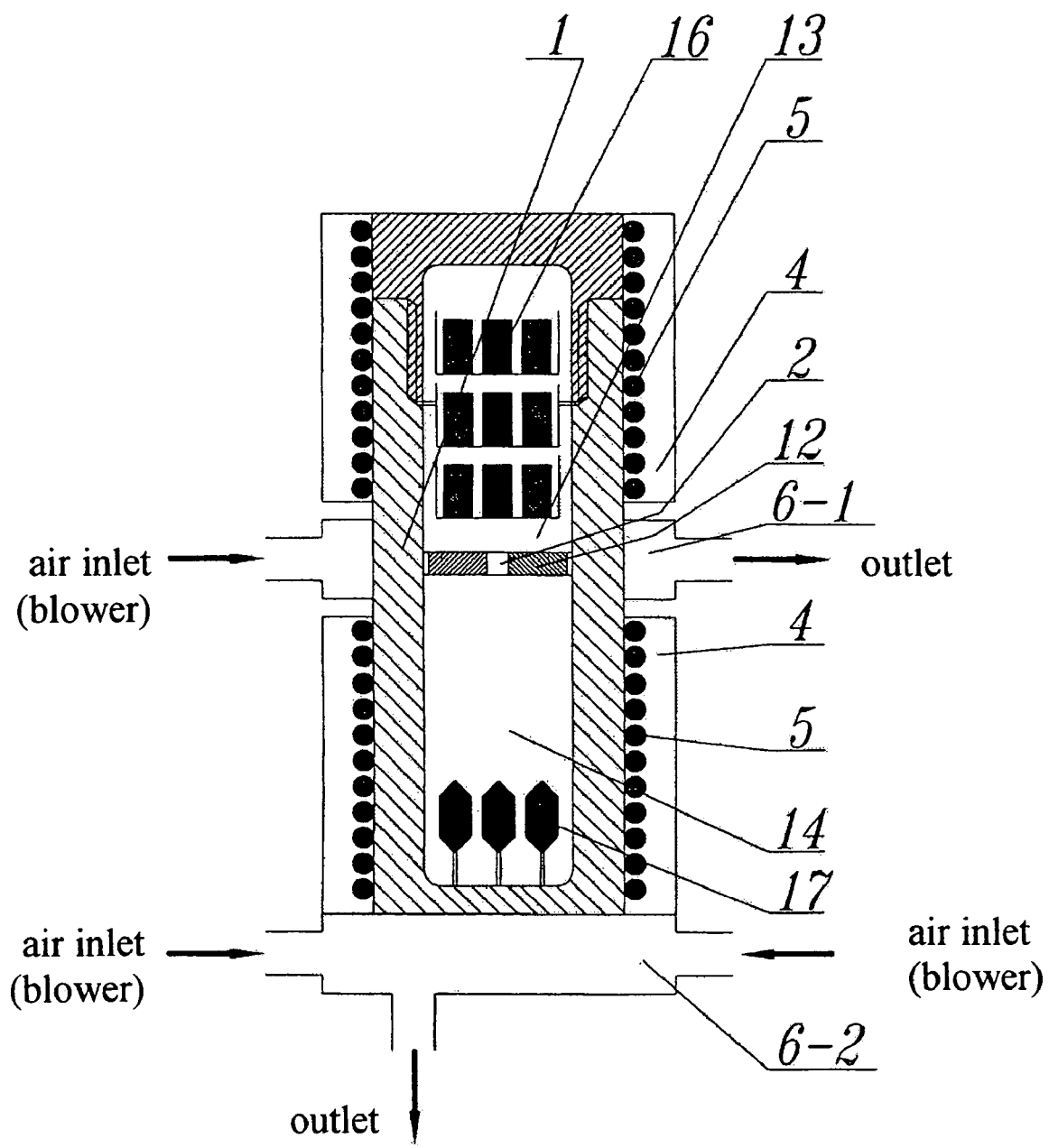
FIG. 3 is a vertical sectional view of the autoclave and the set of furnaces used for carrying out this invention.
Figure 4:
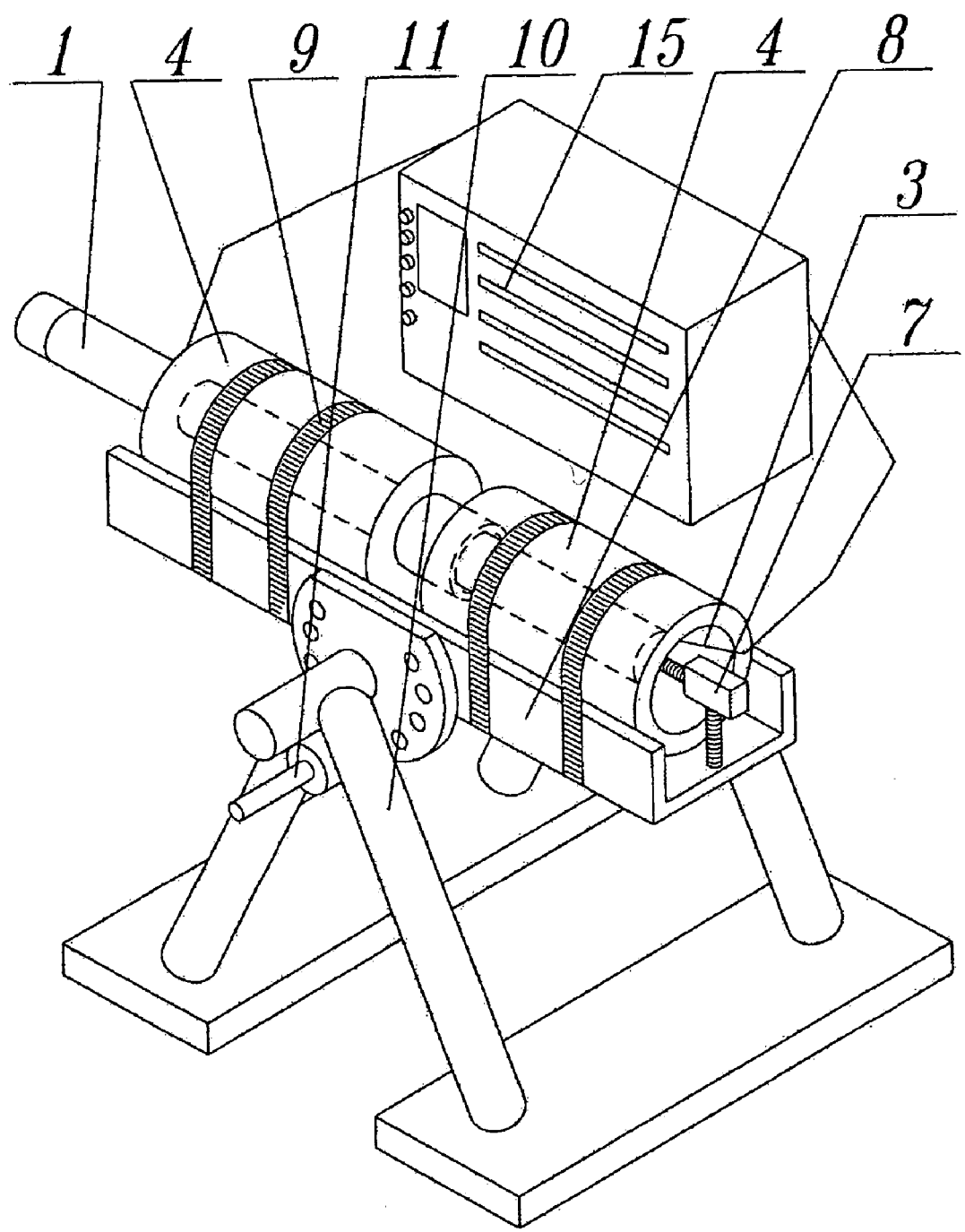
FIG. 4 is a perspective view of the apparatus used for obtaining bulk mono-crystalline gallium nitride.

The apparatus used for obtaining bulk mono-crystals is shown in FIG. 3 and FIG. 4. The basic unit of the apparatus is the autoclave 1 for obtaining a solvent in a supercritical state, equipped with the installation 2 for providing chemical transport through the supercritical solution inside the autoclave 1. The autoclave 1 is placed in the chamber 3 of a set of two furnaces 4 equipped with heating 5 and/or cooling devices 6 and secured in the desired position with respect to the furnaces 4 by means of the screw-type blocking device 7. The furnaces 4 are mounted on the bed 8 and secured with steel bands 9 wrapped around the furnaces 4 and the bed 8. The bed 8 together with the set of furnaces 4 is mounted rotationally in the base 10 and secured at a desired angle by means of the pin interlock 11, allowing to control the rate and type of the convection flow in the autoclave 1. In the autoclave 1 placed in the set of furnaces 4 the convention flow of the supercritical solution occurs, controlled by the installation 2 in the form of the horizontal baffle 12 occupying over 70% of the cross-section of the autoclave, separating the dissolution zone 13 from the crystallization zone 14 in the autoclave 1. The horizontal baffle 12 is placed around the middle of the length of the autoclave. Temperature values in individual zones in the autoclave 1, falling within the range from 100 to 800° C., are set in the furnaces 4 by means of the control device 15. In the autoclave 1 the dissolution zone 13 coinciding with the low-temperature zone of the furnace system 4 is located above the horizontal baffle (or baffles) 12 and the feedstock 16 is added into said zone 13. The feedstock is introduced in the amount of no more than 50% of the volume of the dissolution zone. The feedstock in the form of metallic gallium (or aluminum) is introduced into the crucible in such amount so that its volume should not occupy more than 80% of that of the dissolution zone. The crystallization zone 14 coincides with the high-temperature zone of the furnace set 4 and is located below the horizontal baffle (or baffles) 12. The seed 17 is placed in this zone. The location of the seed 17 is below the intersection of the rising and falling convection streams, slightly above the furnace's bottom. The zone in which the installation 2 regulating the convective flow is located is equipped with the cooling device 6. As the result of cooling the baffle 12 region, the temperature difference between the dissolution zone 13 and the crystallization zone 14 may be controlled. At the level of the bottom of the crystallization zone the cooling device 18 is located, allowing the zone to rapidly cool down after the completion of the process and significantly preventing dissolution of the crystal during the furnace's cooling-off period following the crystallization process.

Thus obtained bulk mono-crystalline gallium nitride can have the surface dislocation density below $10^5/cm^2$ and the half width of the X-ray rocking curve from the (0002) plane below 60 arcsec (for Cu $K\alpha_1$) below 60 arcsec. After slicing it into wafers with a wire saw with an off-angle between 0.05 and 0.2 degree with respect to the principal axis of the crystal, in those conditions it is possible to add to them, using the HVPE method, 3 mm of GaN with n-type electrical conductivity by maintaining the growth rate of 30 μm/h for 100 hours.

Thus obtained bulk mono-crystalline GaN with the width of 5 mm is sliced for 25 hours with a wire saw into 0.5 mm thick wafers. In this manner, it is possible to obtain at least 4 substrates. Those substrates, apart from the high crystalline quality, also have electrical conductivity, so they can be used as substrates for opto-electronic devices made on the basis of semi-conductors, such as laser diodes.

EXAMPLE

Figure 9:
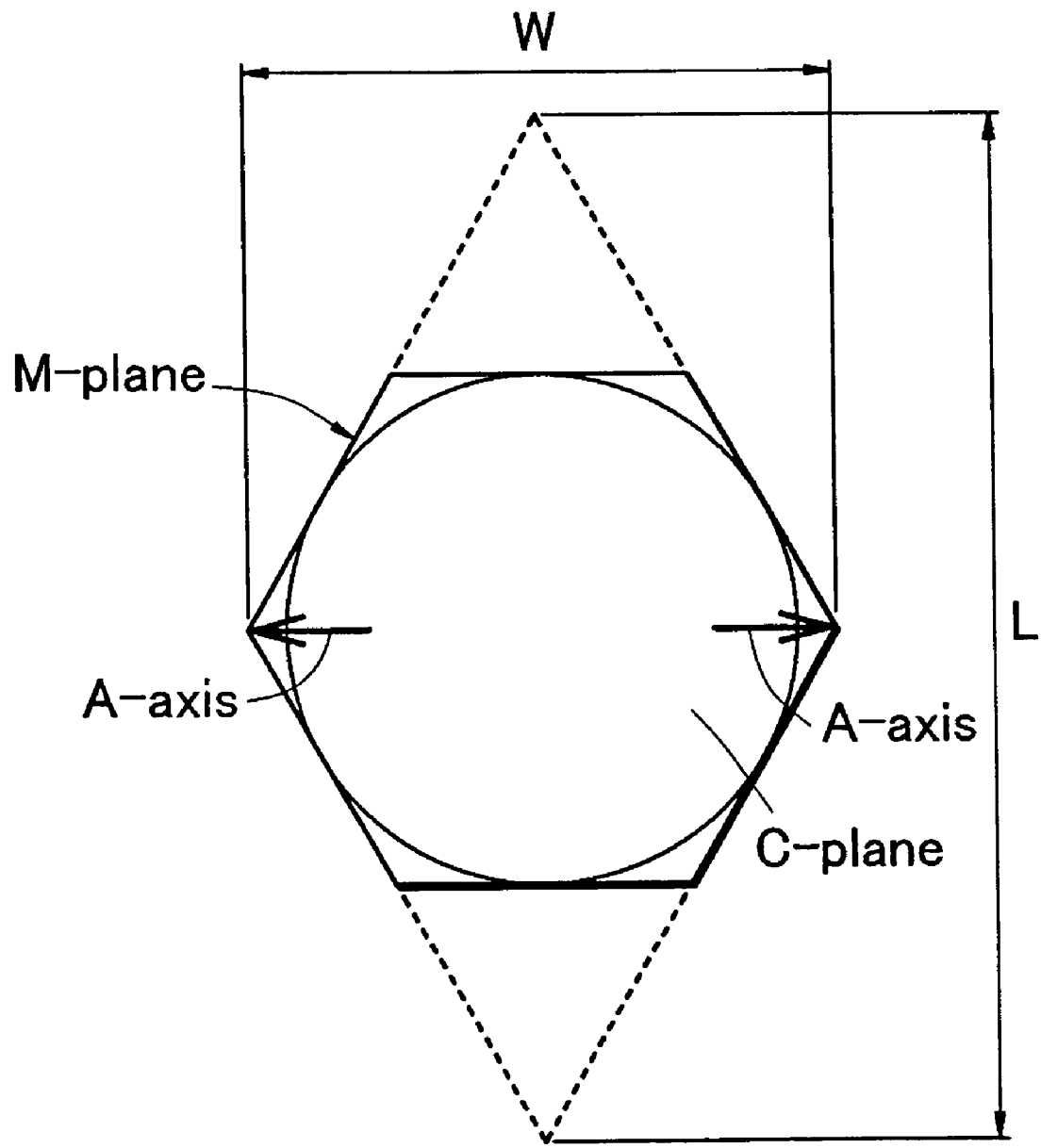
FIG. 9 is a plane view showing a process of making A-axis direction growth seed according to the present invention.

The dissolution zone 13 of a 600 $cm^3$ high pressure autoclave 1, having the inner diameter of 40 mm and length of 480 mm, was charged with 53.0 g of feedstock in the form of metallic gallium (6N). The crystallization zone 14 of the same autoclave was charged with a seed crystal in the form of a gallium nitride wafer (having the diameter of about 1 inch and the mass of 2.0 g) obtained by means of A-axis direction growth in the supercritical ammono method as shown in FIG. 9. (the seed is made of the wafer having a length (L), an A-axis direction growth (W) from both sides of A-plane and edge periphery of M-planes)

As the mineralizer, 12.0 g of 4N metallic sodium as well as 19.5 g of 4N metallic potassium were put into the autoclave. Next, the autoclave was filled with 255.0 g of ammonia (5N), tightly closed and put into a set of furnaces 4. The temperature of the dissolution zone 13 was raised to 450° C. (at 1° C./min, FIG. 6), while the crystallization zone was not heated and its temperature did not exceed 250° C. In this way, supercritical ammonia-containing solution was obtained with the following molar ratio: $KNH_2:NH_3$=0.035; $NaNH_2:NH_3$=0.035. This temperature distribution was maintained in the autoclave for 4 days (FIG. 6), during which partial dissolution of gallium and a complete reaction of undissolved gallium to polycrystalline GaN took place.

Figure 6:
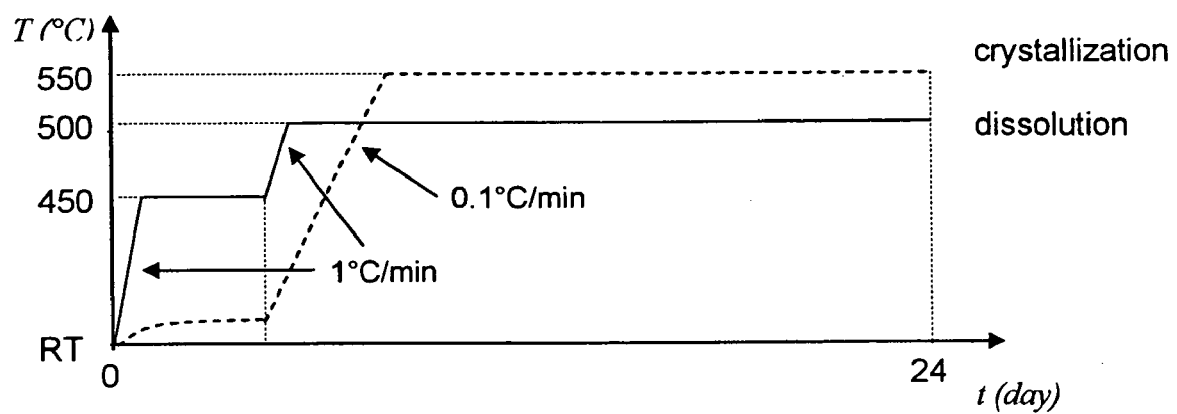
FIG. 6 is a graph showing the change in time of the temperature in the autoclave for the purposes of this Example.
Figure 7:
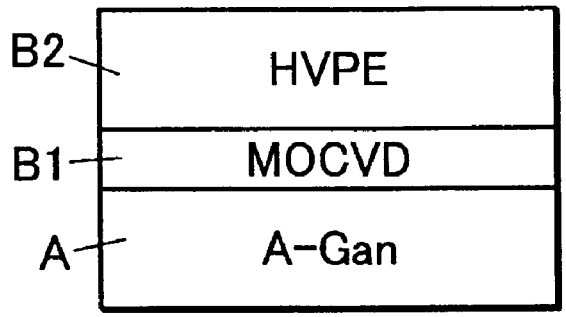
FIG. 7 is a schematic sectional view of the first embodiment of the template type substrate according to the present invention.
Figure 8:
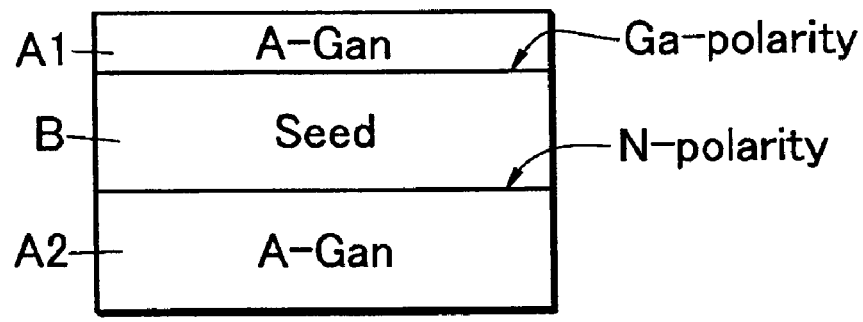
FIGS. 8A and 8B are schematic sectional views of the second embodiment of the template type substrate according to the present invention.
Figure 8:
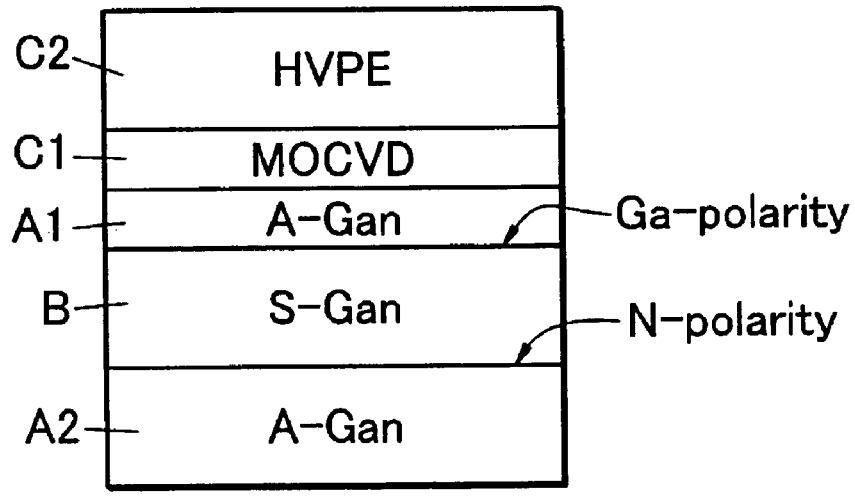

Next, the temperature of the dissolution zone was increased to 500° C. (at 1° C./min), the temperature of the crystallization zone was slowly increased to 550° C. (at 0.1° C./min, FIG. 6), with the pressure inside the autoclave reaching about 280 MPa. The autoclave was kept under those conditions (the second step of the process) for the subsequent 20 days (FIG. 6). As a result of the process, partial dissolution of the feedstock (i.e. polycrystalline GaN) was observed in the dissolution zone and crystallization of gallium nitride on the HVPE seed took place in the crystallization zone. The gallium nitride crystallized on both sides of the seed in the form of mono-crystalline layers with the total thickness of about 2 mm.

Crystals obtained in a similar supercritical ammono method were subjected to the following processes in order to use them as substrates:

1) The 5 mm mono-crystalline layer deposited on the seed of HVPE-GaN was placed in the furnace and subjected to annealing for between 1 to 5 hours in the nitrogen atmosphere containing low amounts of oxygen and in the temperature between 600° C. and 900° C.
2) The sample was then placed on a wire saw made by the Takatori Corp. The sample was situated at an angle below 1 degree in order to give it the proper off-angle with respect to the principal axis of the crystal. Then, the sample was sliced into 5 wafers using a wire saw, thus obtaining samples with the off-angle of between 0.05 and 0.2 degrees.
3) The samples were then placed in the furnace and again subjected to annealing for between 1 and 5 hours in the nitrogen temperature containing low amounts of oxygen and in the temperature between 600° C. and 900° C. (Thus prepared samples are called as GaN substrates hereinafter)
4) GaN substrates were then mounted on worktables, placed into a polishing machine manufactured by Logitech Ltd. and polished consecutively on both sides. In the polishing process diamond tools as well as silica, or alumina slurries (with pH from 3 to 6 or else from 9 to 11) were used. The roughness of the obtained surfaces was lower than 10 Å.
5) A protective GaN or AlGaN layer (1 to several-micron thick) was then added to the surface of the GaN substrate using the HVPE or MOCVD method thus obtaining the template-type substrate.
6) Alternatively, on the GaN substrate with the afore-described protective layer, or on the GaN substrate without the protective layer, a 3 mm-thick GaN layer was created using the HVPE method in the below specified conditions.

After slicing and polishing in accordance with the afore-described methods a 0.5 mm-thick template-type substrate was obtained for use in opto-electronic devices.

The conditions of the HVPE process were as follows: reaction temperature: 1050° C., reaction pressure: atmospheric (0.1 Mpa), partial ammonia pressure: 0.03 MPa, partial pressure $GaCl_3$:100 Pa, hydrogen carrier gas.

If necessary, there may be carried out the step of removing impurities from bulk mono-crystalline nitride by a process of rinsing in the environment of supercritical ammonia-containing solvent, water or carbon dioxide or being subjected to the action of gaseous hydrogen, nitrogen or ammonia. In this case, it is preferable that the step of rinsing may be carried out with aid of the application of ultrasounds or the exposure to an electron beam.

INDUSTRIAL APPLICABILITY

The resulting template type substrate is very useful for the epitaxy substrate from gaseous phase such as MOCVD, MBE and HVPE, resulting in possibility of making good opto-electric devices such as Laser Diode and large-output LED and good electric devices such as MOSFET.

The invention claimed is:

1. A process of preparing a template type substrate which comprises steps of:
   (a) preparing a layer A) of bulk mono-crystal nitride containing at least one element of alkali metals (Group I, IUPAC 1989) to have a thichness for substrate by crystallization of gallium or aluminum-containing nitride on a seed from a super-critical ammonia-containing solution, and (b) forming a layer B) of nitride by means of vapor phase epitaxy growth on Al or Gapolar face of the layer A) to get a substrate comprising the layer A) and the layer B) combined at Al or Ga-polar face of the layer A) and N-polar face of the layer B).

2. A process of preparing a template type substrate according to claim 1, which comprises further step of (c) polishing one of the faces of the layer B) to get a substrate for vapor phase epitaxy.

3. A process of preparing a template type substrate according to claim 2, which comprises further step of annealing the substrate comprising the layers A) and B) in the atmosphere that does not contain hydrogen but does contain oxygen at temperature between approx. 600 and 1050° C., thus producing material with better crystalline quality than before the annealing.

4. A process of preparing a template type substrate according to claim 3, wherein the step of annealing is carried out in the atmosphere of inert gas with an addition of oxygen between 10 and 30 vol. %.

5. A process of preparing a template type substrate according to claim 4, wherein the step of annealing is carried out in a single step or in multiple steps until the desired level of impurities (such as hydrogen and/or ammonia or ions formed from the impurities formed during the crystallization and/or annealing process) is reached.

6. A process of preparing a template type substrate according to claim 3, which comprises further step of removing impurities from bulk mono-crystalline nitride by a process of rinsing in the environment of supercritical ammonia-containing solvent, water or carbon dioxide or being subjected to the action of gaseous hydrogen, nitrogen or ammonia.

7. A process of preparing a template type substrate according to claim 1, wherein the step of rinsing is carried out with aid of the application of ultrasounds or the exposure to an electron beam.

* * * * *

UNITED STATES PATENT AND TRADEMARK OFFICE
CERTIFICATE OF CORRECTION

PATENT NO.         : 7,410,539 B2                                          Page 1 of 1
APPLICATION NO. : 10/538654
DATED              : August 12, 2008
INVENTOR(S)        : Robert Dwilinski et al.

It is certified that error appears in the above-identified patent and that said Letters Patent is hereby corrected as shown below:

On title page, Item (75) Inventors
 "Yasuo Kanbara, Aman (JP)" should read -- Yasuo Kanbara, Anan-shi (JP) --

Signed and Sealed this

Fourth Day of November, 2008

JON W. DUDAS
*Director of the United States Patent and Trademark Office*